United States Patent [19]

Vogelsang et al.

[11] Patent Number: 5,540,977
[45] Date of Patent: Jul. 30, 1996

[54] MICROELECTRONIC COMPONENT

[75] Inventors: Thomas Vogelsang, Essex Junction, Vt.; Wolfgang Roesner, Munich, Germany

[73] Assignee: Siemens Aktiengesellschaft, Munich, Germany

[21] Appl. No.: 365,932

[22] Filed: Dec. 29, 1994

[30] Foreign Application Priority Data

Jan. 19, 1994 [DE] Germany .................... 44 01 422.2

[51] Int. Cl.$^6$ .................................................. H01L 21/28
[52] U.S. Cl. .................... 428/210; 428/209; 428/433; 428/446; 174/261
[58] Field of Search .................... 428/210, 209, 428/433, 446

[56] References Cited

U.S. PATENT DOCUMENTS 5,376,435  12/1994  Morozumi ................... 428/210

FOREIGN PATENT DOCUMENTS 0576263  6/1993  European Pat. Off. .
4212220  10/1993  Germany .

OTHER PUBLICATIONS

"Single–Electronics: Correlated Transfer of Single Electrons in Ultrasmall Junctions, Arrays, and Systems," Likharev, Granular Nanoelectronics, Ferry et al. (Eds.), 1991, pp. 371–391.

"Elektronik mit einzelnen Elektronen," Galdun et al., Physik in unserer Zeit, vol. 23, No. 4, 1992, pp. 159–165.

"Observation of Macroscopic Quantum Tunneling Through the Coulomb Energy Barrier," Geerligs et al., Physical Review Letters, vol. 65, No. 24, Dec. 10, 1990, pp. 3037–3040.

"Single–Electron Tunnelling Observed at Room Temperature by Scanning–Tunnelling Microscopy," Schönenberger et al., Europhysics Letters, No. 20, vol. 3, pp. 249–254 (1992).

"Metal–Cluster Compounds and Universal Features of the Hopping Conductivity of Solids," van Stavern et al., pp. 1–96.

"Controlled Transfer of Single Charge Carriers," Urbina et al., IEEE Trans. on Mag., vol. 27, No. 2, Mar. 1991, pp. 2578–2580.

"Frequency–Locked Turnstile Device for Single Electrons," Geerligs et al., Physical Review Letters, vol. 64, No. 22, May 28, 1990, pp. 2691–2694.

*Primary Examiner*—Patrick J. Ryan
*Assistant Examiner*—Kam F. Lee
*Attorney, Agent, or Firm*—Hill, Steadman & Simpson

[57] ABSTRACT

A microelectronic component has a substrate on which a layer structure and at least two contact structures are arranged. The layer structure and the contact structures are electrically connected to one another but are electrically insulated from the substrate. The layer structure is formed by one layer of individual elements that are electrically connected to one another via quantum-mechanical tunnel contacts.

8 Claims, 4 Drawing Sheets

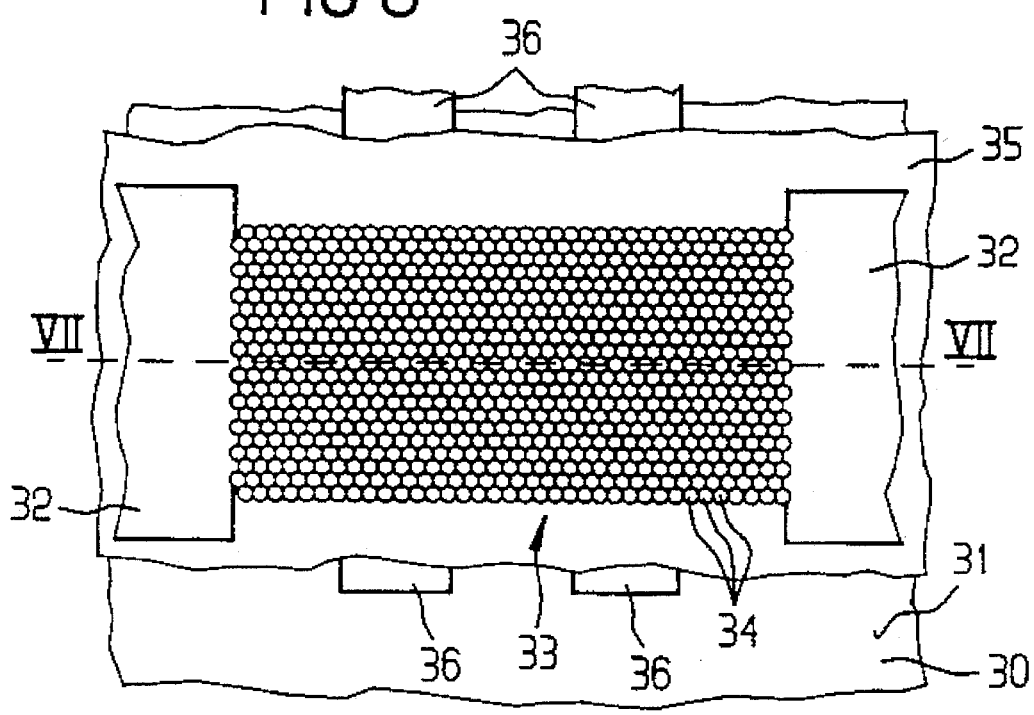
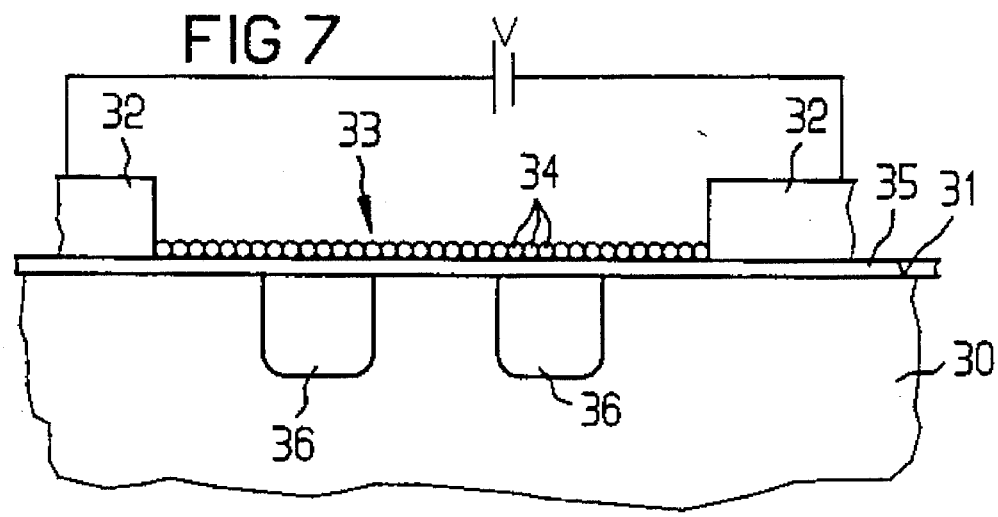

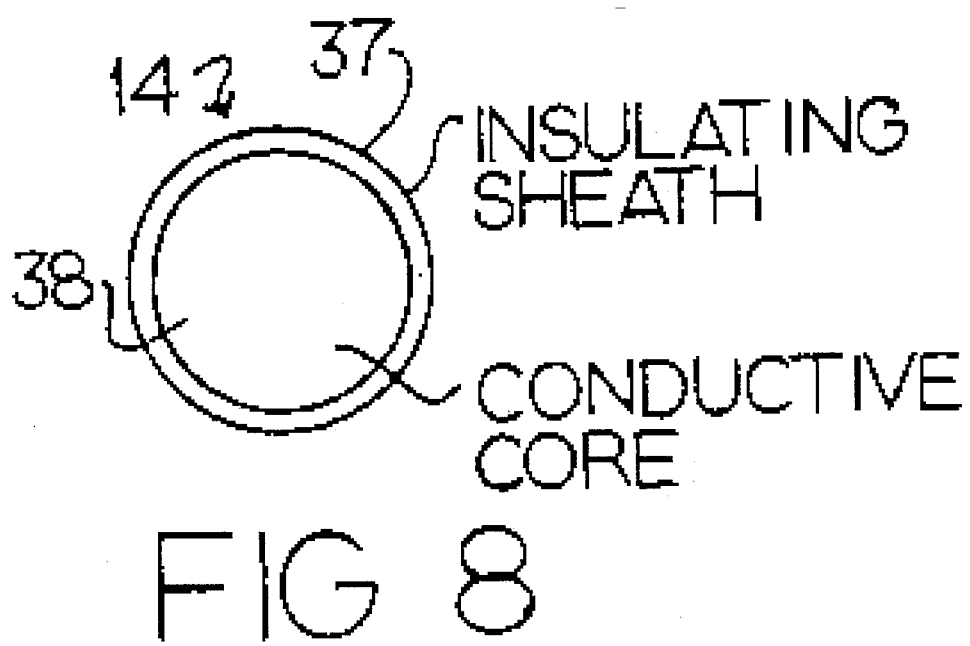

MICROELECTRONIC COMPONENT

BACKGROUND OF THE INVENTION

1. Field of the Invention

The present invention is directed to a microelectronic component of the type using a quantum mechanical effect.

2. Description of the Prior Art

Microelectronic components wherein a quantum-mechanical effect is utilized are acquiring significance in view of the development of extremely fast LSI electronic components. Interest in the field is directed, among other things, to the effect of the Coulomb blockade that is described in K. K. Likharev, Granular Nanoelectronics, D. K. Ferry editor, Plenum, New York (1991) pages 371 ff.

The Coulomb blockade arises because the energy of the overall system changes when an electron tunnels through a tunnel contact. A tunnel contact is a structure that comprises two electrodes separated by an insulating layer, with the insulating layer being so thin that a tunnelling of individual electrons through the insulating layer occurs. The energy modification of the overall system lies on the $q_e^2/C$ order of magnitude of wherein $q_e$ is the charge of an electron and C is the capacitance of the tunnel contact. When this energy modification is an energy elevation clearly above the thermal energy of the system $k_BT$, wherein $k_B$ is the Boltzmann constant and T is the absolute temperature, then a tunnelling of the electron through the tunnel contact does not occur. The current through the tunnel contact is thus blocked. When, by contrast, the energy modification lies on the order of or is below the thermal energy, i.e. $q_e^2/C \leq k_BT$, then a tunnelling of an electron over the tunnel contact can occur.

The utilization of the Coulomb blockade is therefore possible given structures in the range of 30 through 100 nm that are operated in the millikelvin range (see, for example, E. Gladun et al, Physik in unserer Zeit, Vol. 23 (1992), pages 159 ff and L. J. Geerligs et al, Phys. Rev. Lett., Vol. 65 (1990), pages 3030 ff) or given structures having a size clearly below 10 nm that are operated at higher temperatures (see, for example, C. Schoenenberger et al, Europhys. Lett., Vol. 20 (1992), pages 249 ff).

For example, two electrodes of aluminum are employed in the tunnel contact in the former instance, a thin oxide layer being arranged between these two electrodes (see A. Gladun et al, Physik in unserer Zeit, Vol. 23 (1992), pages 159 ff). Such a Coulomb blockade component is only functional at extremely low temperatures. The electrical properties of this tunnel contact can be set via a scaling of the components.

According to an estimate made based on the energy modification and thermal energy, the Coulomb blockade effect only occurs at room temperature given elements having a tunnel contact with a capacitance of $10^{-18}$F or below. Such elements have an expanse on the order of magnitude of a few nanometers.

The contacting of such small elements ensues with the assistance of scanning microscopes such as the scanning tunnelling microscope or the atomic power microscope (see C. Schoenenberger et al, Europhys. Lett., Vol. 20 (1992), pages 249 ff). Other possibilities of contacting elements on this order of magnitude are not known.

Metal clusters that are surrounded by an insulating sheath have been proposed as tunnel contact elements having nanometer size (see German OS 42 12 220). The electrical properties of these tunnel contact elements are determined by the size and the nature of the metal clusters as well as by the insulating sheathes.

In German OS 42 12 220, microelectrodes, i.e. scanning microscopes, are employed for contacting individual tunnel elements. Such a contacting is in fact expedient for testing and scientific examination of such tunnel elements; it is unsuitable, however, for the employment of the tunnel elements as a microelectronic component within a complex circuit arrangement.

It is disclosed as a practical embodiment in German OS 42 12 220 to accept the individual elements in a receptacle mount as a fill and to correspondingly contact them via the receptacle mount, or to form a pressed member by compressing the individual elements under high pressure, this pressed member being provided with contacts. Component members are formed in this way as a wafer having a diameter of 5 mm and a thickness of 0.379 mm. Dimensions of 2 through 10 mm for the diameter and 0.1 through 1 mm for the thickness are preferred. Such components have a cut-off voltage on the order of magnitude of kilovolts, which is unbeneficial for employment in microelectronics.

SUMMARY OF THE INVENTION

An object of the present invention is to provide a microelectronic component that is scalable and can be lithographically manufactured and that, in particular, is functional at room temperature.

The above object is achieved in accordance with the principles of the present invention in a microelectronic component having a substrate with a principal face, a layer structure on the principal face of the substrate and at least two contact structures in electrical contact with the layer structure, also arranged on the principal face of the substrate. The layer structure includes a plurality of individual elements contained in one layer of the layer structure, with the individual elements and the contact structures being electrically insulated from the substrate. The individual elements are electrically connected to each other by quantum-mechanical contacts.

In the component of the invention, individual elements that form a layer structure are arranged side-by-side in a layer on the principal face of a substrate. The individual elements are connected to one another via quantum-mechanical tunnel contacts. This means that each individual element has an electrically conductive region and is insulated from the electrically conductive region of the neighboring individual elements by an insulating layer. The insulating layer is dimensioned such that the conductive regions of neighboring individual elements and the insulating layer arranged therebetween form a tunnel contact.

All structures that satisfy this condition qualify as the aforementioned individual elements. In particular, structures that have a conductive core and an insulating sheath surrounding the conductive core are suitable as individual elements. The diameter of the individual element thereby preferably lies between 1 and 10 nm. The capacitance of the individual elements is so low in this size range that the component functions in the room temperature range. In particular, metal clusters having organic ligands as the insulating sheath, as disclosed by German OS 42 12 220, or fullerenes having an enclosed metal core, are suitable as individual elements.

Other materials suitable as individual elements are also recited in M. P. J. van Staveren et al, Phys. Rep., Vol. 208

(1991) No. 1 but are not disclosed therein as a layer structure but instead as volume-filling material.

It is also within the scope of the invention to form the layer structure of a porous semiconductor material, preferably silicon, that is etched so severely that a continuous conductive connection no longer exists via the pores. Grains of the semiconductor material located between the pores act as conductive regions in such porous semiconductor materials. In particular, porous silicon that is formed by anodic etching in a fluorine-containing electrolyte is suitable as such a porous semiconductor material.

At least two contact structures that are electrically connected to the layer structure are provided in the microelectronic component. The two contact structures are preferably arranged at opposite sides of the layer structure. The contact structures are thereby arranged on the principal face of the substrate such that individual elements located at the edge of the layer structure are in contact with the respective contact structure. Contact structures lying opposite to one another have a spacing of, preferably, between 20 and 500 nm. The layer structure has an expanse in a range between 20 nm and 10 μm perpendicularly relative thereto. Such dimensions can be manufactured with the assistance of electron beam lithography or deep UV lithography.

The contact structures are preferably formed of doped polysilicon or of a metal.

The layer structure and the contact structures are electrically insulated from the substrate. When an insulating material such as, for example, glass or sapphire is employed as the substrate, no additional measures are required for insulation. When silicon is employed as a substrate, sufficient insulation is provided by an insulating layer at whose surface the contact structures and the layer structures are arranged.

When the distance between the two contact structures amounts to L and the size of the individual elements amounts to a, then a voltage drop U/(L/a) occurs between two individual elements that neighbor one another in the L direction when a voltage U is applied between the two contact structures. A uniform charge distribution is thereby assumed. When this voltage part per individual element amounts to less than the threshold voltage of the Coulomb blockade, then the microelectronic component inhibits. When, by contrast, this part amounts to more than the threshold voltage of the Coulomb blockade, then the microelectronic component conducts. The threshold voltage $U_{th}$ of the component is established by $U_{th}=q_e L/6Ca$, when each individual element has six neighbors, whereby C is the capacitance between two neighboring individual elements. When, for example, the expanse of the individual elements amounts to 2 nm, the capacitance amounts to $0.5 \times 10^{-18}$F and the spacing between the contact structures amounts to 50 nm, then the threshold voltage for the entire microelectronic component amounts to 1.3 volts. This means that the component inhibits when a voltage below 1.3 volts is applied between the contact structures; when by contrast, a voltage above 1.3 volts is applied, then the component conducts. This threshold voltage is of a size that can be rationally employed.

It is within the scope of the invention to provide a surface of the layer structure that is aligned parallel to the principal face of the substrate with a gate dielectric. A gate electrode is arranged on the surface of the gate dielectric, this gate electrode being insulated from the layer structure and from the contact structures by the gate dielectric. The threshold voltage for the Coulomb blockade can be influenced by applying a control voltage to the gate electrode. This embodiment of the microelectronic component of the invention represents a controllable Coulomb blockade component.

When this embodiment of the inventive component is realized using a substrate of silicon, it is advantageous to first apply the gate electrode onto the substrate, then to apply the gate dielectric onto the gate electrode, and then to apply the contact structures and the layer structure on the gate dielectric. In this case, the contact structures and the layer structure are electrically insulated from the substrate by the gate dielectric. The silicon process steps can be implemented first in this way before the layer structure is deposited between the contact structures. The gate electrode in this case can be realized as an implanted diffusion region in the surface of the substrate.

According to a version of this embodiment, at least two gate electrodes are arranged on the surface of the gate dielectric. As a result thereof, the component of the invention can be realized as an electron pump of the type described, for example, from C. Urbina et al, IEEE Trans. Magn., Vol. 27 (1991), pages 2578 ff. In such an electron pump, a specific charge amount per period can run through the arrangement by applying suitable alternating voltages to the gate electrodes. As a result, a direct current can be produced whose size is controlled by the frequency of the alternating voltage.

DESCRIPTION OF THE DRAWINGS

FIG. 6 shows a plan view onto a component constructed in accordance with the principles of the present invention having two gate electrodes that can be employed as a "revolving door" arrangement.

FIG. 7 shows a section through the component taken along line VII—VII in FIG. 6.

FIG. 8 is a schematic sectional illustration of an individual element used in the diode structure of FIGS. 1 and 2, the component of FIGS. 4 and 5, and the component of FIGS. 6 and 7.

DESCRIPTION OF THE PREFERRED EMBODIMENTS

Figure 1:
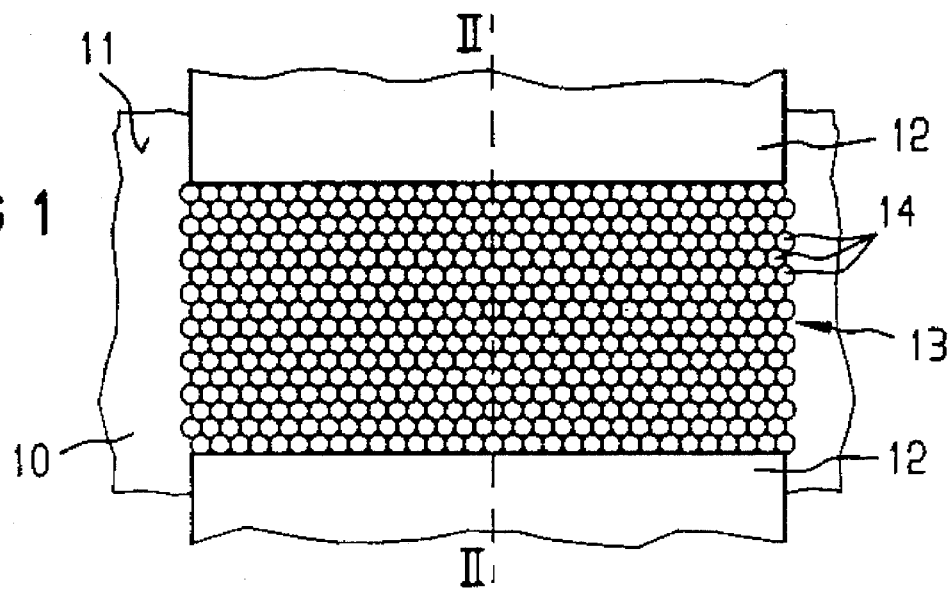
FIG. 1 is a plan view onto a diode structure constructed in accordance with the principles of the present invention.
Figure 2:
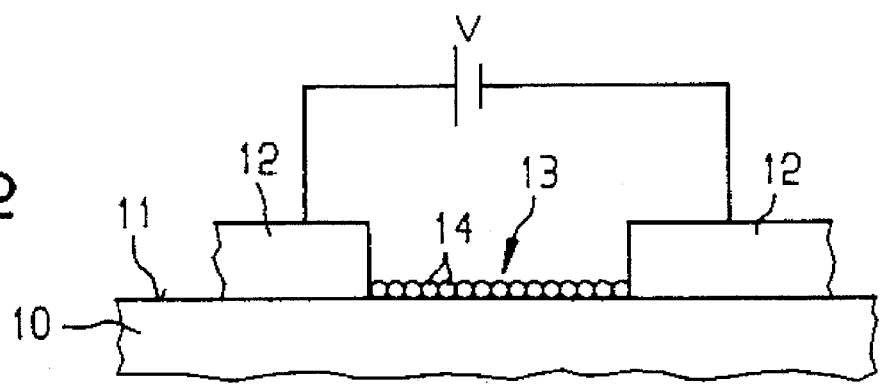
FIG. 2 shows a section through the diode structure taken along line II—II in FIG. 1.

The diode structure of FIGS. 1 and 2 has a substrate 10 with a principal face 11. The substrate 10 is insulating at least in the region of the principal face 11. It is composed, for example, of silicon having a $SiO_2$ layer in the region of the principal face 11. Alternatively, the substrate 10 may be composed of glass or sapphire.

Two contact structures 12 are arranged on the principal face 11 of the substrate 10. The contact structures 12 are composed, for example, of doped polysilicon or a metal, preferably aluminum or titanium. Parallel to the principal face 11, the contact structures 12 have a width of, for example, 1 µm. The contact structures 12 can be implemented as part of leads or can be contacted toward the outside through a via hole. The spacing between the two contact structures 12 amounts, for example, to 50 nm. A layer structure 13 is arranged between the two contact structures 12. The layer structure 13 is formed by a number of individual elements that are arranged on the principal face 11 as a single layer. Neighboring individual elements 14 touch one another. Individual elements 14 that are arranged at the edge of the layer structure 13 and adjoin a contact structure 12 are in contact with the respective contact structure 12. The layer structure has an expanse of, for example, 1 µm perpendicularly relative to the connecting line between the contact structures 12.

As shown in FIG. 8, each individual element 14 (and 24 and 34 discussed below) has a conductive core 38 surrounded by an insulating sheath 37.

The individual elements 14 may be, for example, metal clusters having organic ligands that form an insulating sheath around the metal cluster, fullerenes having an enclosed metal core, or porous semiconductor material that is etched to such an extent that a continuous conductive material connection no longer exists and such that the semiconductor material is essentially composed of pores and semiconductor grains. Metal clusters having a sheath of organic ligands are preferably employed as an individual element 14, the metal cluster comprising 55 gold atoms. Such an individual element 14 has a diameter of approximately 2 nm. The capacitance between neighboring individual elements is approximately $0.2 \times 10^{-18}$ F.

Neighboring individual elements 14 are connected to one another via a quantum tunnel contact. When a voltage V is applied between the contact structures 12, this voltage being of such a size that the voltage drop across an individual element 14 is lower than the threshold voltage $U_{th}$ of a tunnel contact, then no current can flow through the layer structure 13. When, by contrast, the voltage between the contact structures 12 is so high that the voltage drop across each individual element 14 is higher than the threshold voltage $U_{th}$ for the tunnel contact, then electrons can tunnel via the tunnel contacts and a current flow occurs between the contact structures 12 through the layer 13.

Figure 3:
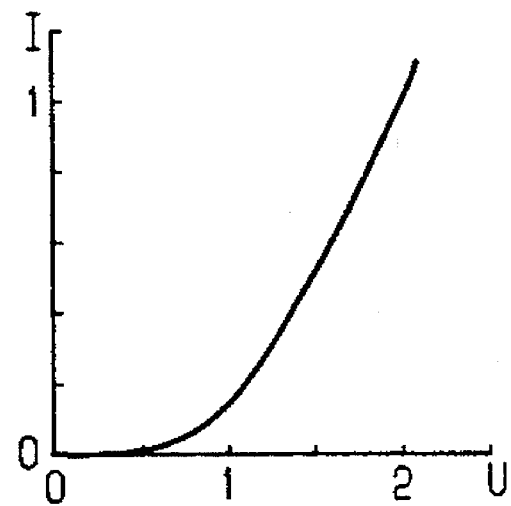
FIG. 3 shows the current-voltage characteristic of the diode structure illustrated in FIG. 1 and FIG. 2.

FIG. 3 shows the current (I)/voltage (U) characteristic of the diode structure of FIGS. 1 and 2. The current 1 is graphed in units $I_o=(W.U_{th})/(L.R_T)$. $R_T$ is thereby the resistance of a tunnel contact and W is the dimension of the contact structures 12 perpendicularly relative to the spacing of the contact structures 12. $U_{th}$ amounts, for example, to 1.3 V; $R_T$ amounts, for example, to 100 kΩ; W amounts, for example, to 1 µm; L amounts, for example, to 50 nm. U is graphed in units of the threshold voltage $U_{th}$ of the overall component.

Figure 4:
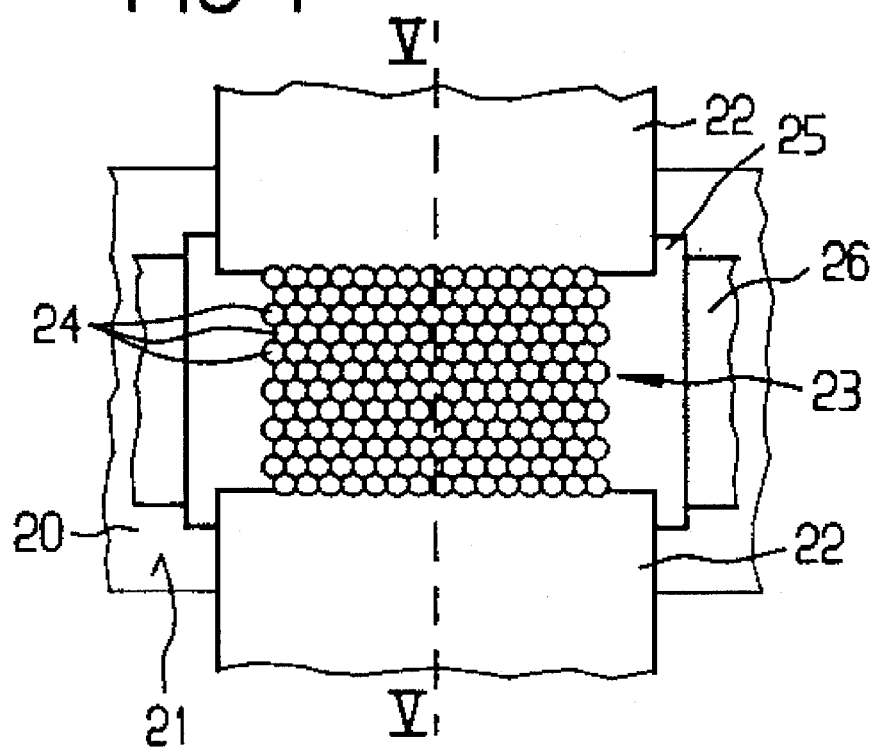
FIG. 4 is a plan view onto a component constructed in accordance with the principles of the present invention having a gate electrode.
Figure 5:
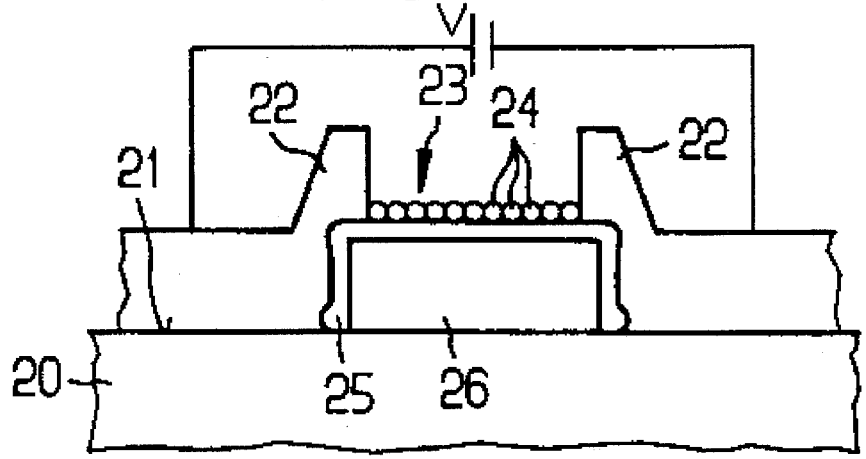
FIG. 5 shows a section through the component taken along line V—V in FIG. 4.

A substrate 20 has a principal face 21 (see FIGS. 4 and 5). The substrate 20 is insulating at the principal face 21. The substrate 20 is preferably composed of silicon having a $SiO_2$ layer. Alternatively, the substrate 20 is completely composed of insulating material, for example glass or sapphire.

A gate dielectric 25 and a gate electrode 26 are arranged on the principal face 21 next to two contact structures 22, and a layer structure 23 that is composed of a single layer of individual elements 24. The gate electrode 26 is arranged on the principal face 21. The gate electrode 26 is composed, for example, of doped polysilicon or of a metal, preferably aluminum or titanium. The gate electrode 26 has a thickness of, for example, 50 nm.

A gate dielectric 25 is arranged on the surface of the gate electrode 26. The gate dielectric 25 is composed of, for example, $SiO_2$ and has a thickness of, for example, 10 nm.

The contact structures 22 are arranged at opposite sides of the gate electrode 26. The contact structures 22 preferably overlap the edge of the gate electrode 25. The contact structures 22 have a spacing of, for example, 50 nm. The contact structures 22 have a width of, for example, 1 µm parallel to the principal face 21. The thickness of the contact structures 22 amounts, for example, to 50 nm. The layer structure 23 is arranged at the surface of the gate dielectric 25 between the contact structures 22. The layer structure 23 is formed by the individual elements 24 that are arranged in one layer. Neighboring individual elements 24 touch one another. Individual elements 24 that are arranged at the sides of the layer structure 23 adjoining the contact structures 22 touch the respective contact structure 22.

The individual elements 24 are preferably metal clusters having 55 gold atoms that are surrounded by a sheath composed of an organic ligand. Alternatively, the individual elements 24 can also be other metal clusters having an organic ligand sheath, fullerenes having an enclosed metal core or porous semiconductor materials.

The height of the potential barrier of the tunnel contacts that exists between neighboring individual elements 24 changes by applying a control voltage to the gate electrode 26. For a given voltage V between the contact structures 22, a current between the contact structures 22 can therefore be influenced by varying the control voltage at the gate electrode 26.

A substrate 30 has a principal face 31. A gate dielectric 35 is arranged on the principal surface 31 next to contact structures 32, and a layer structure 33 which is formed by individual elements 34 arranged in one layer. The substrate 30 has two gate electrodes that adjoin the principal face 31.

The substrate 30 is composed, for example, of monocrystalline silicon. The gate electrodes 36 are realized as implanted diffusion regions in the substrate 30 (see FIGS. 6 and 7) and are insulated from the substrate 30 by pn-junctions.

The gate dielectric 35 is arranged on the principal face 31. It covers the entire region for the component. The gate dielectric 35 is composed of, for example, $SiO_2$ and has a thickness of, for example, 10 nm.

Two contact structures 32 are arranged at the surface of the gate dielectric 35. The contact structures 32 are composed, for example, of doped polysilicon or of a metal, preferably of aluminum or titanium. The contact structures 32 have a thickness of, for example, 50 nm. A spacing of, for example 150 nm is present between the contact structures 32.

The gate electrodes 36 are arranged such in the substrate 30 such that they lie between the contact structures 32.

The layer structure 33 is arranged at the surface of the gate dielectric 35 between the contact structures 33. The layer structure 33 is formed of the individual elements 34 that are arranged between the contact structures 32 as a single layer. Individual elements 34 that directly neighbor one another touch. Those individual elements 34 that are arranged at an edge of the layer structure 33 neighboring the contact structures 32 touch the respective contact structure 32.

The individual elements 34 are preferably metal clusters having 55 gold atoms that are surrounded by an insulating, organic ligand sheath. The insulating sheathes between neighboring metal clusters form a Coulomb barrier. The individual elements 34 have dimensions of approximately 2 nm. Alternatively, the individual elements can be metal clusters of a different size that are surrounded by an insulating sheath or can be fullerenes having an enclosed metal core or can be composed of porous semiconductor material.

The contact structures 32 and the layer structure 33 are insulated from the substrate 30 by the gate dielectric 35. The contact structure 32, the layer structure 33, the gate dielectric 35 and the two gate electrodes 36 form a component wherein charge can be shifted clocked from the one contact structure to another by applying appropriate control voltages to the gate electrodes 36. This forms an electron pump based on a principle similar to that described in C. Urbina et al, IEEE Trans. Magn., Vol. 27 (1991), pages 2578 ff.

Although modifications and changes may be suggested by those skilled in the art, it is the intention of the inventors to embody within the patent warranted hereon all changes and modifications as reasonably and properly come within the scope of their contribution to the art.

We claim as our invention:

1. A microelectronic component for use with a voltage source comprising:

a substrate having a principal face;

at least two contact structures disposed on said principal face of said substrate with a spacing between said two contact structures and said two contact structures being connectible to said voltage source;

a planar layer structure disposed on said principal face of said substrate filling said spacing between, and in electrical contact with, said two contact structures and including a layer comprised of a plurality of contiguous individual elements arranged next to each other in a plane having a first dimension parallel to said spacing and a second dimension perpendicular to said first dimension, each of said contact structures being in contact with multiple ones of said plurality of individual elements along said second dimension;

said substrate consisting of electrically insulating material at least in a region of said substrate including said principal face for electrically insulating said individual elements and said contact structures from a remainder of said substrate; and each of said individual elements having a core composed of electrically conductive material surrounded by an insulating sheath, the respective insulating sheaths of adjacent individual elements touching and having a plurality of quantum tunnel contacts respectively electrically connecting the respective cores of said adjacent individual elements in said layer, said quantum tunnel contacts having a tunneling threshold and becoming conductive when a voltage drop across an individual element exceeds said tunneling threshold.

2. A microelectronic component as claimed in claim 1 wherein said conductive core and said insulating sheath of each individual element have, in combination, a diameter between 0.1 and 10 nm.

3. A microelectronic component as claimed in claim 1 wherein each individual element comprises a metal atomic cluster having organic ligands forming said insulating sheath.

4. A microelectronic component as claimed in claim 1 wherein each individual element comprises a fullerene having an enclosed metal core.

5. A microelectronic component as claimed in claim 1 wherein said individual elements comprise porous semiconductor material severely etched so that said porous semiconductor material has an exterior with no continuous, conductive connection thereon.

6. A microelectronic component as claimed in claim 1 wherein said layer structure has said first dimension in a range between 20 nm and 500 nm parallel to a spacing between said contact structures, and said second dimension in a range between 20 nm and 10 µm perpendicular to said first dimension.

7. A microelectronic component as claimed in claim 1 wherein said layer structure has a surface oriented parallel to said principal face of said substrate, and said microelectronic component further comprising a gate dielectric on said surface of said layer structure and at least one gate electrode disposed on a surface of said gate dielectric at a side thereof facing away from said layer structure.

8. A microelectronic component as claimed in claim 7 comprising at least two of said gate electrodes disposed on said surface of said gate dielectric.

* * * * *